(12) United States Patent
Um

(10) Patent No.: US 11,119,950 B2
(45) Date of Patent: Sep. 14, 2021

(54) STORAGE DEVICE AND METHOD OF OPERATING THE SAME

(71) Applicant: SK hynix Inc., Gyeonggi-do (KR)

(72) Inventor: Gi Pyo Um, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 51 days.

(21) Appl. No.: 16/443,451

(22) Filed: Jun. 17, 2019

(65) Prior Publication Data

US 2020/0151117 A1    May 14, 2020

(30) Foreign Application Priority Data

Nov. 13, 2018    (KR) ......................... 10-2018-0138907

(51) Int. Cl.
| | |
|---|---|
| *G06F 12/02* | (2006.01) |
| *G06F 13/16* | (2006.01) |
| *G11C 16/26* | (2006.01) |
| *G06F 3/06* | (2006.01) |

(52) U.S. Cl.
CPC .......... *G06F 13/1668* (2013.01); *G06F 3/061* (2013.01); *G06F 3/064* (2013.01); *G06F 3/0631* (2013.01); *G06F 3/0679* (2013.01); *G06F 12/0246* (2013.01); *G06F 12/0253* (2013.01); *G06F 12/0292* (2013.01); *G11C 16/26* (2013.01)

(58) Field of Classification Search
CPC ............. G06F 12/0246; G06F 12/0253; G06F 12/0292; G06F 13/1668; G06F 3/0608; G06F 3/061; G06F 3/0616; G06F 3/0631; G06F 3/064; G06F 3/0652; G06F 3/0679

See application file for complete search history.

(56) References Cited

U.S. PATENT DOCUMENTS

| | | | |
|---|---|---|---|
| 2006/0155920 A1* | 7/2006 | Smith | ...................... G06F 3/064 |
| | | | 711/103 |
| 2013/0179753 A1* | 7/2013 | Flynn | .................. G06F 11/1008 |
| | | | 714/773 |

FOREIGN PATENT DOCUMENTS

| | | |
|---|---|---|
| KR | 10-2010-0115090 | 10/2010 |
| KR | 10-2017-0050953 | 5/2017 |

* cited by examiner

*Primary Examiner* — Yong J Choe
(74) *Attorney, Agent, or Firm* — IP & T Group LLP

(57) ABSTRACT

A memory controller may control a memory device, which includes two or more planes each including a plurality of memory blocks, which are capable of being simultaneously operated, wherein each of two or more memory blocks in different planes, among the two or more planes, stores a plurality of data chunks. The memory controller may include a data map generator configured to generate a data map indicating locations of stored valid data chunks, among the plurality of data chunks, a read sequence determinator configured to determine a read sequence in which the valid data chunks are to be read based on the data map, and a command input controller configured to provide a read command for the valid data chunks to the memory device based on the read sequence.

17 Claims, 15 Drawing Sheets

READ SEQUENCE INFORMATION a

| Read Seq | Plane_0 (BLK_0) | | Plane_1 (BLK_0) | |
|---|---|---|---|---|
| | Page Offset | Data Chunk | Page Offset | Data Chunk |
| 1 | 0 | 3 | 0 | 4 |
| 2 | 1 | 10 | - | - |
| 3 | 2 | 16, 17, 18, 19 | 2 | 20 |
| 4 | - | - | 2 | 21, 22, 23 |
| 5 | - | - | 3 | 28, 29, 30, 31 |

READ SEQUENCE INFORMATION_b

| Read Seq | Plane_0 (BLK_0) | | Plane_1 (BLK_0) | |
|---|---|---|---|---|
| | Page Offset | Data Chunk | Page Offset | Data Chunk |
| 1 | 2 | 16, 17, 18, 19 | 2 | 20, 21, 22, 23 |
| 2 | - | - | 3 | 28, 29, 30, 31 |
| 3 | 0 | 3 | 0 | 4 |
| 4 | 1 | 10 | - | - |

STORAGE DEVICE AND METHOD OF OPERATING THE SAME

CROSS-REFERENCE TO RELATED APPLICATION

The present application claims priority under 35 U.S.C. § 119(a) to Korean patent application number 10-2018-0138907, filed on Nov. 13, 2018, which is incorporated herein by reference in its entirety.

BACKGROUND

Field of Invention

Various embodiments of the present disclosure generally relate to an electronic device, and more particularly, to a storage device and a method for operating the storage device.

Description of Related Art

A storage device stores data under the control of a host device, such as a computer or a smartphone. The storage device may include a memory device in which data is stored and a memory controller which controls the memory device. Such memory devices are classified into a volatile memory device and a nonvolatile memory device.

The volatile memory device is a memory device in which data is stored only when power is supplied and in which stored data is lost when the supply of power is interrupted. Examples of the volatile memory device include a Static Random Access Memory (SRAM) and a Dynamic Random Access Memory (DRAM).

The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), and a flash memory.

SUMMARY

Various embodiments of the present disclosure are directed to a storage device having improved speed of a garbage collection operation and a method for operating the storage device.

An embodiment of the present disclosure may provide for a memory controller which controls a memory device, wherein the memory device includes two or more planes each including a plurality of memory blocks, which are capable of being simultaneously operated, wherein each of two or more memory blocks in different planes, among the two or more planes, stores a plurality of data chunks. The memory controller may include a data map generator configured to generate a data map indicating locations of stored valid data chunks, among the plurality of data chunks, a read sequence determinator configured to determine a read sequence in which the valid data chunks are to be read based on the data map, and a command input controller configured to provide a read command for the valid data chunks to the memory device based on the read sequence.

An embodiment of the present disclosure may provide for a method for operating a memory controller for controlling a memory device, wherein the memory device, which includes two or more planes each including a plurality of memory blocks, which are capable of being simultaneously operated, wherein each of two or more memory blocks in different planes, among the two or more planes, stores a plurality of data chunks. The method may include generating a data map indicating locations of stored valid data chunks, among the plurality of data chunks, determining a sequence in which the valid data chunks are to be read based on the data map depending on whether read operations on the valid data chunks are simultaneously performed, and providing a read command for the valid data chunks to the memory device in the read sequence.

An embodiment of the present disclosure may provide for a storage device. The storage device may include a memory device including multiple planes, each having a plurality of memory blocks, and a memory controller configured to generate a data map indicating locations at which valid data chunks, among a plurality of data chunks included in two or more memory blocks included in different planes among the plurality of memory blocks, are stored, determine a read sequence in which the valid data chunks are to be read based on the data map depending on whether read operations on valid data chunks are simultaneously performed, and read the valid data chunks in the read sequence.

An embodiment of the present disclosure may provide for a storage device. The storage device may include a memory device including multiple planes, each including a plurality of memory blocks and a controller configured to: select a victim block storing valid data chunks and invalid data chunks; generate information indicating storing locations of the victim block for the valid data chunks; determine a read sequence of the valid data chunks using the information, based on whether each of a plurality of pages stores only valid data chunks, each of the plurality of pages storing at least one of the valid data chunks; and control the memory device to read the valid data chunks based on the read sequence, and store the read valid data chunks in a free block.

DETAILED DESCRIPTION

Figure 1:
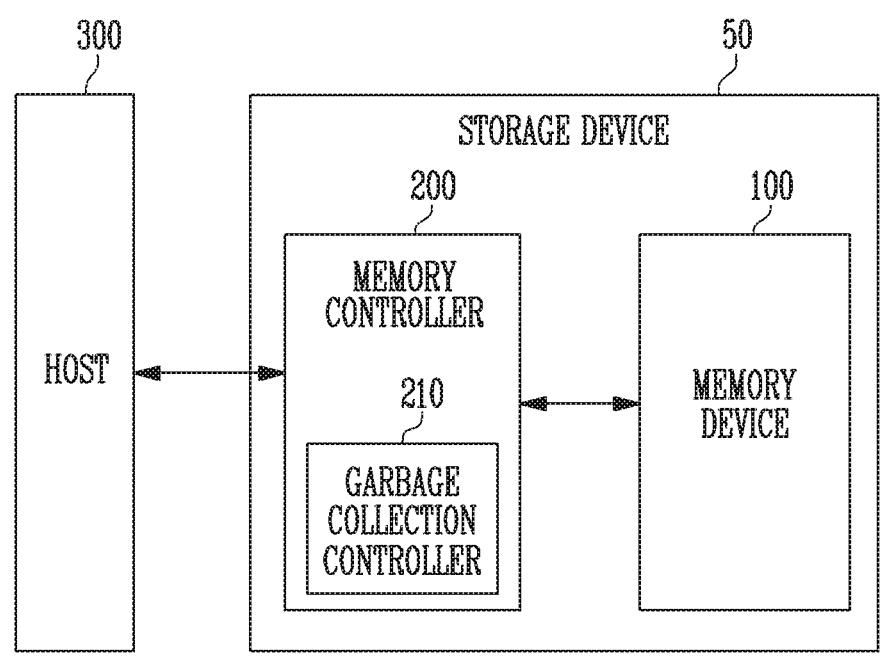
FIG. 1 is a diagram illustrating a storage device in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will not be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art, and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are illustrated, so that those of ordinary skill in the art can easily carry out the technical idea of the present disclosure.

FIG. 1 is a diagram illustrating a storage device 50 in accordance with an embodiment of the present disclosure.

Referring to FIG. 1, the storage device 50 may include a memory device 100 and a memory controller 200. The storage device 50 may store data under the control of a host 300, such as a mobile phone, a smartphone, an MP3 player, a laptop computer, a desktop computer, a game console, a television (TV), a tablet personal computer (PC), or an in-vehicle infotainment system.

The storage device 50 may be manufactured as any one of various types of storage devices depending on a host interface that is a scheme for communication with the host 300. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-e or PCIe) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (PoP), system in package (SiP), system on chip (SoC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made for a memory device 100 which is a NAND flash memory.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory controller 200 controls the overall operation of the storage device 50.

When power is applied to the storage device 50, the memory controller 200 may run firmware (FW). When the memory device 100 is a flash memory device, the memory controller 200 may run firmware such as a flash translation layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored.

The memory controller 200 may control the memory device 100 so that a program operation, a read operation, or an erase operation is performed in response to a request received from the host 300. During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a program command, an address, and data regardless of a request from the host 300, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 depending on an interleaving scheme to improve operating performance.

In an embodiment, the memory controller 200 may include a garbage collection controller 210.

The garbage collection controller 210 may perform a garbage collection operation. The garbage collection operation may be a background operation of securing available free blocks by storing valid data, stored in victim blocks, in an additional memory block and by erasing the victim blocks. In an embodiment, when the memory device 100 includes multiple planes, the memory controller 200 may control the memory device 100 so that the memory device 100 performs a multi-plane operation of simultaneously performing respective operations on the multiple planes. Therefore, in this case, at least two memory blocks respectively included in different planes may be determined to be victim blocks. Also, pieces of valid data stored in the victim blocks may be simultaneously read through a multi-plane read operation. The valid data may be data that is not requested to be updated by the host 300, among pieces of data stored. Invalid data may be data that is requested to be updated by the host 300, among the pieces of data stored.

The garbage collection controller 210 may read valid data stored in the victim blocks so as to perform a garbage collection operation. Each memory block may store a plurality of data chunks. The data chunks may be divided into valid data chunks indicating valid data and invalid data chunks indicating invalid data. Therefore, the garbage collection controller 210 may read valid data chunks stored in victim blocks.

The garbage collection controller 210 may generate a data map that is information indicating locations at which valid data chunks, stored in the victim blocks, are stored. The data map may indicate, for each page offset, which one of a valid data chunk and an invalid data chunk corresponds to each of the plurality of data chunks stored in the victim blocks. Each page offset may be a page number indicating the corresponding page, among pages included in a memory block.

The garbage collection controller 210 may determine a read sequence in which valid data chunks are to be read based on the generated data map. The garbage collection controller 210 may read the valid data chunks in the determined read sequence.

The garbage collection controller 210 may store the read valid data chunks in free blocks. When the storage of the valid data chunks, stored in the victim blocks, in the free blocks is completed, the garbage collection controller 210 may erase the victim blocks.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
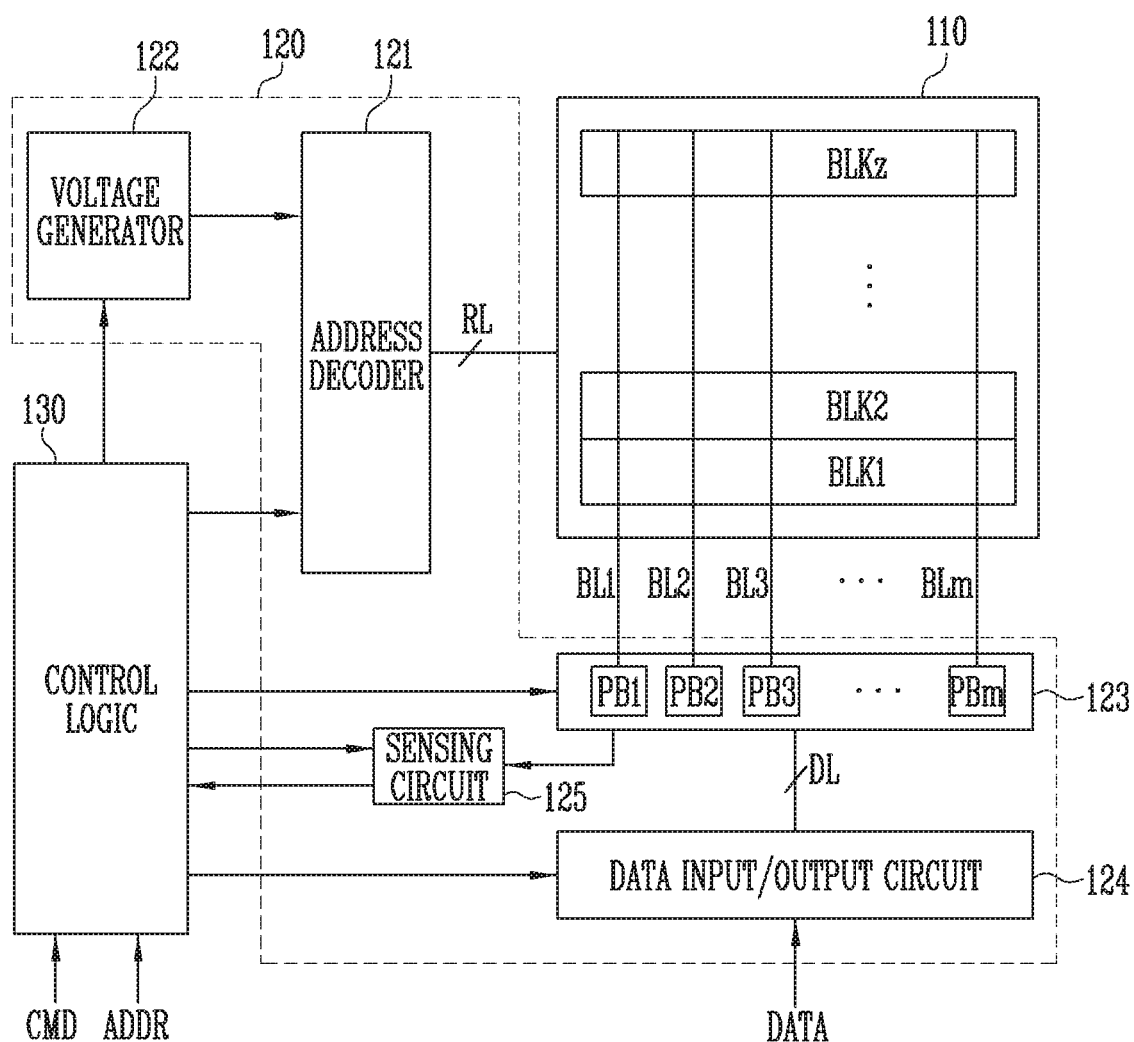
FIG. 2 is a diagram illustrating a memory device of FIG. 1.

FIG. 2 is a diagram illustrating the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and the memory cells, and between a source select transistor and the memory cells.

Each of the memory cells of the memory device 100 may be implemented as a single-level cell (SLC) capable of storing a single bit of data, a multi-level cell (MLC) capable of storing two bits of data, a triple-level cell (TLC) capable of storing three bits of data, or a quad-level cell (QLC) capable of storing four bits of data.

The peripheral circuit 120 may include the address decoder 121, a voltage generator 122, a read and write circuit 123, a data input and output (input/output) circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 receives addresses ADDR from the control logic 130.

The address decoder 121 may decode a block address among the received addresses ADDR. The address decoder 121 selects at least one memory block from among the memory blocks BLK1 to BLKz in response to the decoded block address. The address decoder 121 is configured to decode a row address RADD among the received addresses ADDR. The address decoder 121 may select at least one word line of the selected memory block by applying voltages supplied from the voltage generator 122 to at least one word line WL in response to the decoded row address RADD.

During a program operation, the address decoder 121 may apply a program voltage to the selected word line and apply a pass voltage having a level less than that of the program voltage to unselected word lines. During a program verify operation, the address decoder 121 may apply a verify voltage to a selected word line and apply a verify pass voltage having a level greater than that of the verify voltage to unselected word lines.

During a read operation, the address decoder 121 may apply a read voltage to a selected word line and apply a read pass voltage having a level greater than that of the read voltage to unselected word lines.

In accordance with an embodiment of the present disclosure, the erase operation of the memory device 100 may be performed on a memory block basis. During an erase operation, the addresses ADDR input to the memory device 100 include a block address. The address decoder 121 may decode the block address and select a single memory block in response to the decoded block address. During the erase operation, the address decoder 121 may apply a ground voltage to word lines coupled to the selected memory block.

In accordance with an embodiment of the present disclosure, the address decoder 121 may decode a column address among the received addresses ADDR. The decoded column address may be transferred to the read and write circuit 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels. Further, the voltage generator 122 may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may be operated under the control of the control logic 130.

The first to m-th page buffers PB1 to PBm may transmit and receive data DATA to and from the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. The memory cells in the selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm may read data stored in selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

In an embodiment, while pieces of data stored in some of the plurality of page buffers included in the read and write circuit 123 are being programmed to the memory cell array 110, the remaining page buffers may receive new data from the memory controller 200 and then store the new data.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit VRYBIT signal generated by the control logic 130. Further, the sensing circuit 125 may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device.

The control logic 130 may control the peripheral circuit 120 by generating various types of signals in response to the command CMD and the addresses ADDR. For example, the control logic 130 may generate an operation signal OPSIG, a row address RADD, read and write circuit control signals PBSIGNALS, and an enable bit VRYBIT in response to the command CMD and the addresses ADDR. The control logic 130 may output the operation signal OPSIG to the voltage generator 122, output the row address RADD to the address decoder 121, output the read and write circuit control signals PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

Figure 3:
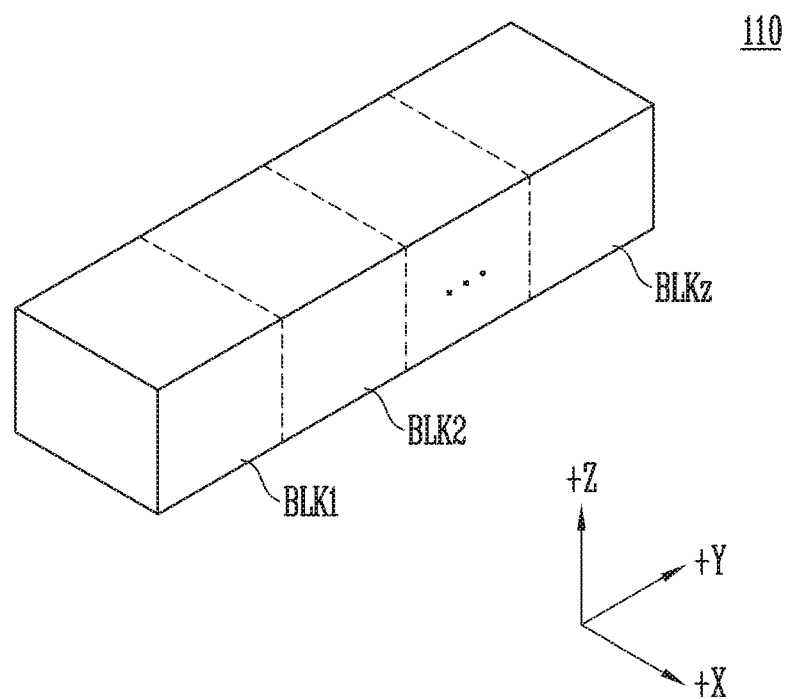
FIG. 3 is a diagram illustrating a memory cell array of FIG. 2.

FIG. 3 is a diagram illustrating the memory cell array 110 of FIG. 2.

Referring to FIG. 3, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 4 and 5.

Figure 4:
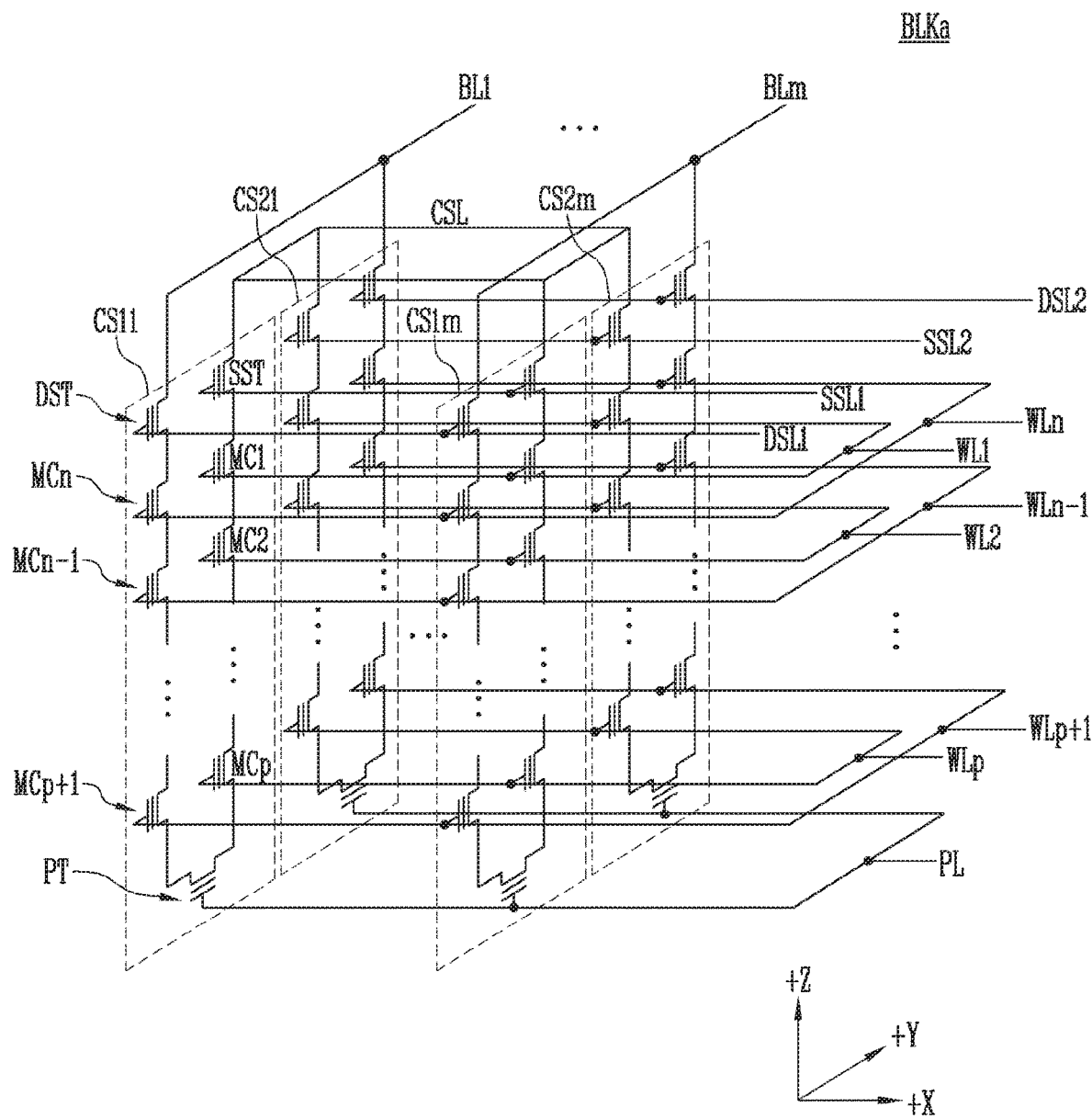
FIG. 4 is a circuit diagram illustrating any one memory block BLKa of memory blocks BLK1 to BLKz of FIG. 3.

FIG. 4 is a circuit diagram illustrating any one memory block BLKa of the memory blocks BLK1 to BLKz of FIG. 3.

Referring to FIG. 4, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for convenience, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings in a row direction are coupled to drain select lines extending in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1$m$ and CS2$m$ in an m-th column are coupled to an m-th bit line BL$m$.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WL$n$.

In an embodiment, even bit lines and odd bit lines, instead of first to m-th bit lines BL1 to BL$m$, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer dummy memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
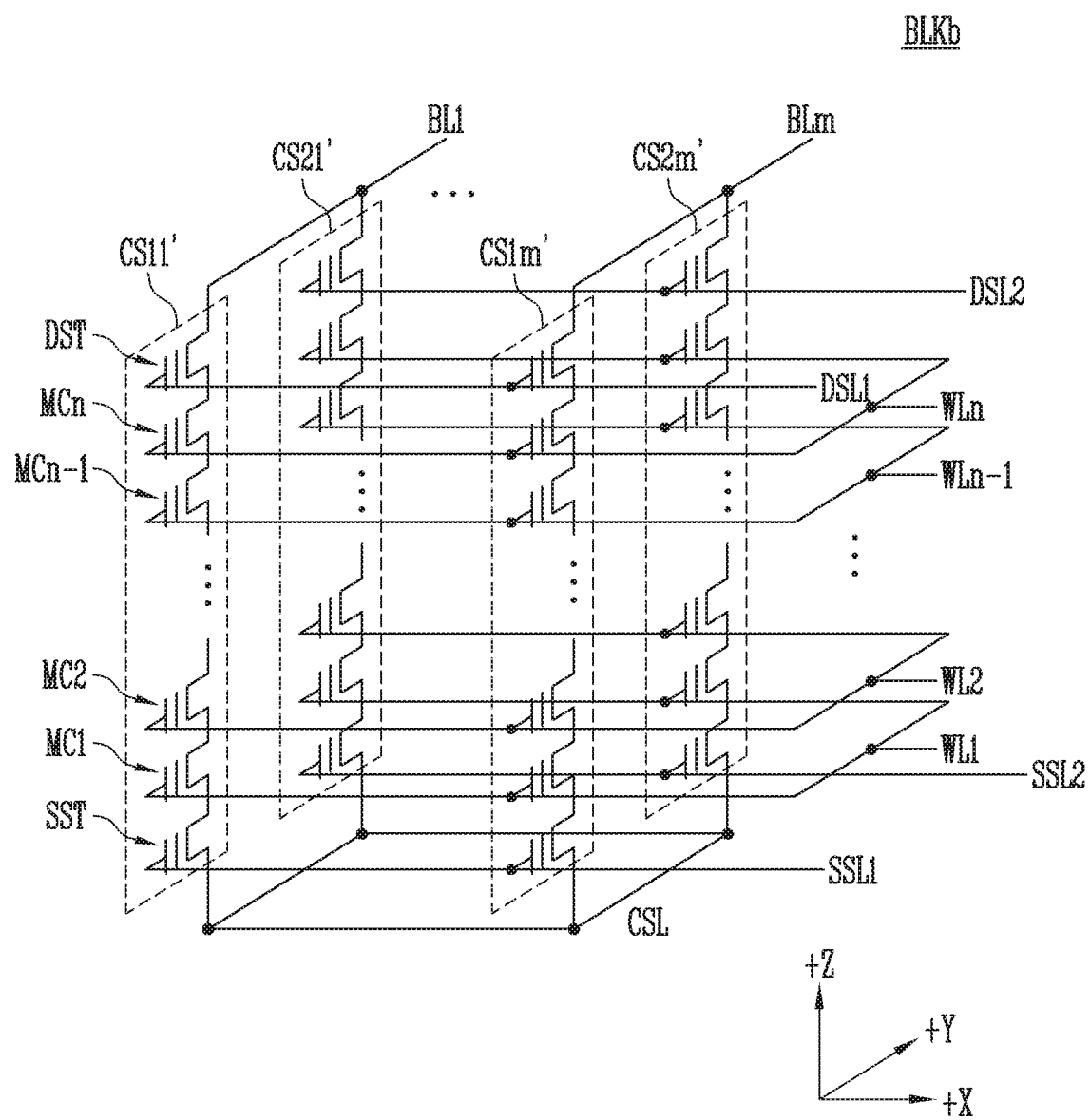
FIG. 5 is a circuit diagram illustrating any one memory block BLKb of the memory blocks BLK1 to BLKz of FIG. 3.

FIG. 5 is a circuit diagram illustrating any one memory block BLKb of the memory blocks BLK1 to BLKz of FIG. 3.

Referring to FIG. 5, the memory block BLKb includes a plurality of cell strings CS11' to CS1$m$' and CS21' to CS2$m$'. Each of the plurality of cell strings CS11' to CS1$m$' and CS21' to CS2$m$' extends in a positive Z (+Z) direction. Each of the cell strings CS11' to CS1$m$' and CS21' to CS2$m$' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1$m$' arranged in a first row are coupled to a first source select line SSL1. Source select transistors of cell strings CS21' to CS2$m$' arranged in a second row are coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WL$n$, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1$m$' in the first row are coupled to a first drain select line DSL1. The drain select transistors of the cell strings CS21' to CS2$m$' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, even bit lines and odd bit lines, instead of first to m-th bit lines BL1 to BL$m$, may be provided. Further, even-numbered cell strings, among the cell strings CS11' to CS1$m$' or CS21' to CS2$m$' arranged in a row direction, may be coupled to the even bit lines, respectively, and odd-numbered cell strings, among the cell strings CS11' to CS1$m$' or CS21' to CS2$m$' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer dummy memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
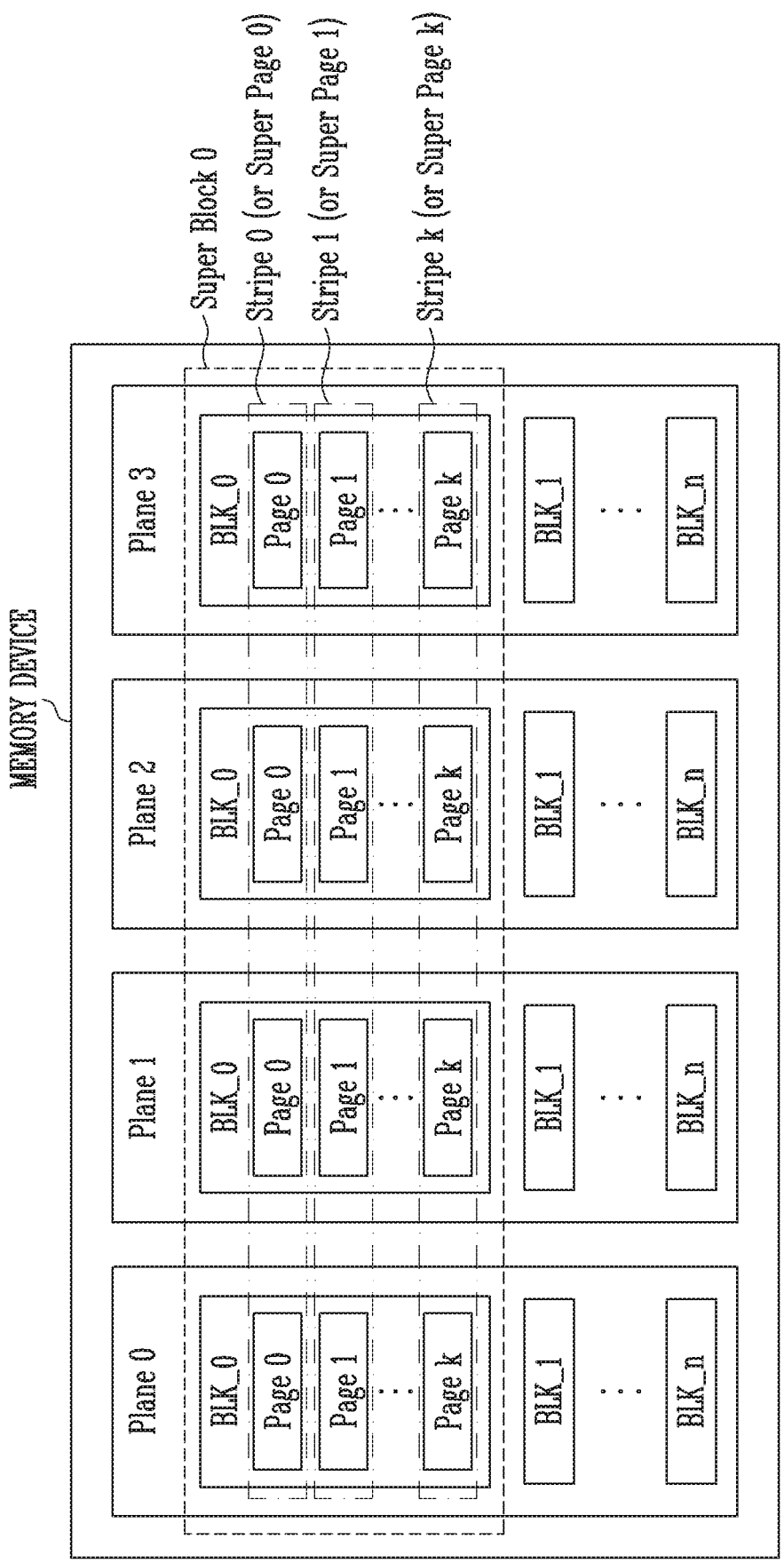
FIG. 6 is a diagram illustrating a multi-plane operation of a memory controller of FIG. 1.

FIG. 6 is a diagram illustrating a multi-plane operation for a memory device by a memory controller 200 of FIG. 1.

Referring to FIG. 6, the memory device (e.g., the memory device 100) may include multiple planes. A single plane may include a plurality of memory blocks, each including a plurality of pages.

For example, the memory device 100 may include 0-th to third planes (Plane 0 to Plane 3). The number of planes included in the memory device 100 is not limited by the embodiment of the present disclosure. Each of the 0-th to third planes may include 0-th to n-th memory blocks BLK_0 to BLK_n (where n is a natural number of 1 or more). Each of the 0-th to n-th memory blocks BLK_0 to BLK_n may include 0-th to k-th pages Page 0 to Page k (where k is a natural number of 1 or more).

A single super block may include at least two memory blocks included in different planes. For example, a 0-th super block (Super Block 0) may include 0-th memory blocks BLK_0 included in 0-th to third planes (Plane 0 to Plane 3), respectively.

A single super block may include a plurality of stripes. The term "stripe" may be used interchangeably with the term "super page". A single stripe or super page may include a plurality of pages. For example, the 0-th stripe (Stripe 0) or the 0-th super page Super Page 0 may include 0-th pages Page 0, respectively included in a plurality of 0-th memory blocks BLK_0 included in the 0-th super block (Super Block 0).

Therefore, a single super block may include a 0-th stripe (Stripe 0) to a k-th stripe (Stripe k). Alternatively, a single super block may include a 0-th super page (Super Page 0) to a k-th super page (Super Page k).

The memory controller 200 may store or read data on a stripe basis or a super page basis when storing data in the memory device 100 or reading the stored data from the memory device 100. That is, the memory controller 200 may perform a multi-plane operation of simultaneously storing data in pages included in at least two planes of the memory device 100 or simultaneously reading stored data from the pages. The memory controller 200 may also perform a multi-plane operation on pages that are included in memory blocks disposed at different locations in different planes. For example, the memory controller 200 may simultaneously store data in the 0-th page Page 0 of the 0-th memory block BLK_0 of the 0-th plane Plane 0 and in the third page Page 3 of the third memory block BLK_3 of the third plane Plane 3, or may simultaneously read the stored data therefrom.

Figure 7:
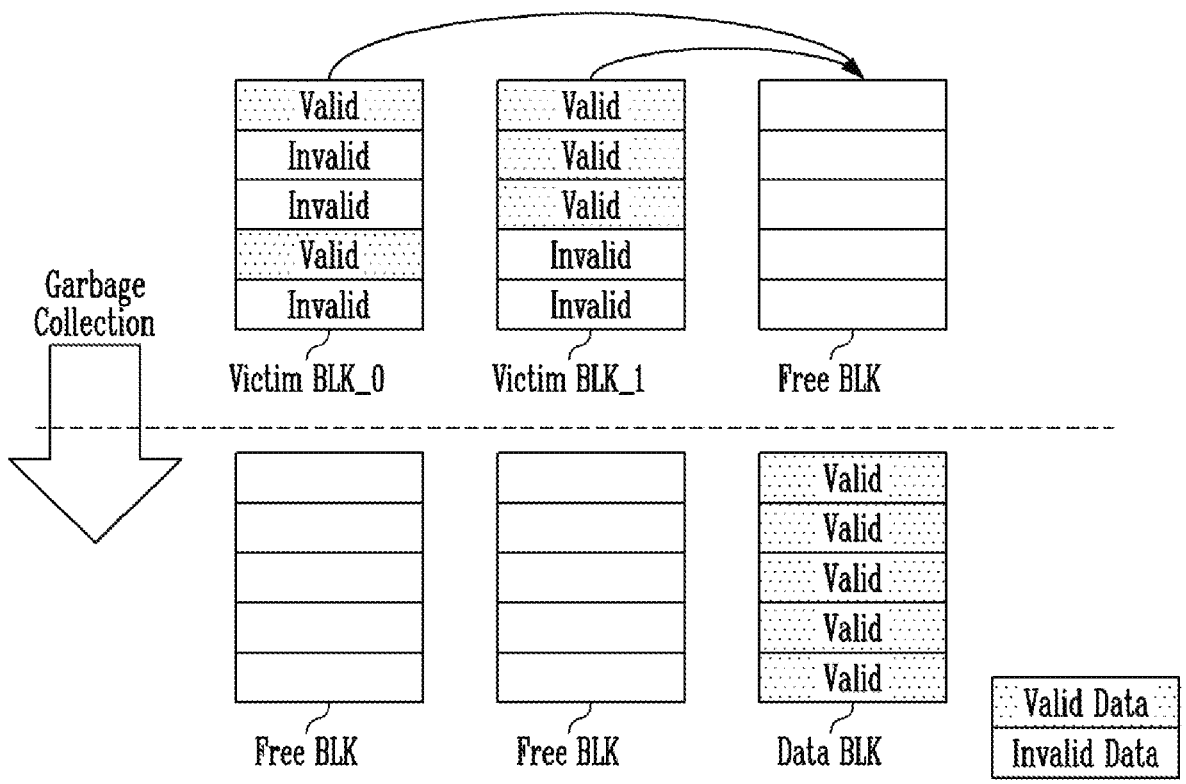
FIG. 7 is a diagram illustrating a garbage collection operation.

FIG. 7 is a diagram illustrating a garbage collection operation.

Referring to FIG. 7, the garbage collection operation may be a background operation of securing available free blocks by storing valid data, stored in victim blocks, in an additional memory block (i.e., free block) and by erasing the victim blocks. Such a free block may be a memory block on which an erase operation has been performed and in which data is not yet stored.

The garbage collection operation may be an operation of reading pieces of valid data, among pieces of invalid data and valid data stored in at least two victim blocks, and storing the valid data in a free block. The free block in which pieces of valid data are stored may be set to a data block. After the pieces of valid data have been stored in the free block, the victim blocks may be erased. The erased victim blocks may be set to free blocks.

In an embodiment, when the memory device 100 of FIG. 1 includes multiple planes, the memory controller 200 may control the memory device 100 so that the memory device 100 performs a multi-plane operation of simultaneously performing respective operations on the multiple planes. Therefore, at least two memory blocks respectively included in different planes may be determined to be victim blocks. Also, pieces of valid data stored in the victim blocks may be simultaneously read through a multi-plane read operation.

For example, when the garbage collection operation is performed, pieces of valid data (Valid Data) stored in a 0-th victim block (Victim BLK_0) and pieces of valid data (Valid Data) stored in a first victim block (Victim BLK_1) may be read and then be stored in a free block (Free BLK). Here, the free block Free BLK may be set to a data block Data BLK. After the pieces of valid data (Valid Data) have been stored in the free block Free BLK, the 0-th victim block (Victim BLK_0) and the first victim block (Victim BLK_1) may be erased, and the erased 0-th victim block (Victim BLK_0) and first victim block (Victim BLK_1) may be set to free blocks Free BLK.

Figure 8:
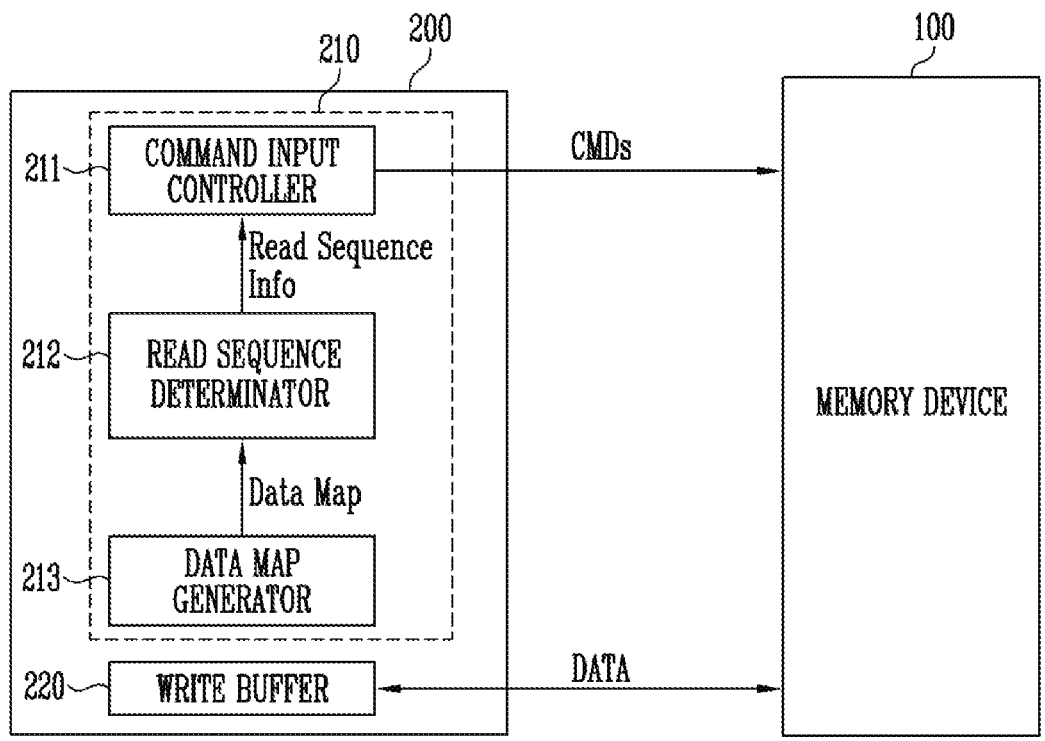
FIG. 8 is a diagram illustrating an operation of a garbage collection controller in accordance with an embodiment of the present disclosure.

FIG. 8 is a diagram illustrating an operation of a garbage collection controller (e.g., the garbage collection controller 210 of FIG. 1) in accordance with an embodiment of the present disclosure.

Referring to FIG. 8, the memory controller 200 may include the garbage collection controller 210 and a write buffer 220.

The garbage collection controller 210 may include a command input controller 211, a read sequence determinator 212, and a data map generator 213.

The command input controller 211 may provide a memory device 100 with a command to be executed while a garbage collection operation is being performed. At this time, the command may include a read command for reading valid data stored in victim blocks. Alternatively, the command may include a program command for storing data, which is read in response to the read command, in a free block. The command may include an erase command for victim blocks after a program operation has been performed in response to the program command.

The command input controller 211 may provide the memory device 100 with a read command for reading valid data, stored in the victim blocks, based on read sequence information (Read Sequence Info) provided by the read sequence determinator 212. The read sequence information (Read Sequence Info) may include a sequence in which pieces of valid data, stored in victim blocks, are to be read.

The read sequence determinator 212 may determine a sequence in which pieces of data stored in memory blocks are to be read, based on a data map (Data Map) provided by the data map generator 213. The read sequence determinator 212 may generate the read sequence information (Read Sequence Info) indicating the determined read sequence based on the data map (Data Map).

For example, the read sequence determinator 212 may generate read sequence information (Read Sequence Info), indicating the sequence in which pieces of data stored in victim blocks are to be read during a garbage collection operation. Further, the read sequence determinator 212 may provide the read sequence information (Read Sequence Info) to the command input controller 211.

The command input controller 211 may provide the memory device 100 with a program command for storing the pieces of valid data, which are read in response to the read command, in a free block. When the valid data in the free block is completely stored, the command input controller 211 may provide the memory device 100 with an erase command for erasing the victim blocks.

The data map generator 213 may generate a data map (Data Map) for memory blocks and provide the data map (Data Map) to the read sequence determinator 212. The data map generator 213 may generate the data map (Data Map) indicating storing locations of pieces of valid data, which are stored in the victim blocks. The data map (Data Map) may be information indicating storing locations of pieces of valid data, among pieces of valid data and invalid data, which are stored in the memory blocks.

Pieces of data stored in a single memory block may be divided into data chunks. That is, the data may be stored on a data chunk basis in each memory block. Each data chunk may be a unit indicating the size of certain data. Here, the certain data size may be set in various manners. In an embodiment, valid data may be valid data chunks, and invalid data may be invalid data chunks.

In an embodiment, the data map may indicate, for each page offset, which one of a valid data chunk and an invalid data chunk corresponds to each of a plurality of data chunks stored in victim blocks. Each page offset may be a page number indicating the corresponding page, among pages included in a memory block.

The write buffer 220 may be a space in which data to be programmed to the memory device 100 is temporally stored. The write buffer 220 may store valid data read from the memory device in response to the read command from the command input controller 211. The valid data stored in the write buffer may be programmed to memory blocks included in the memory device 100 in response to the program command from the command input controller 211.

Figure 9:
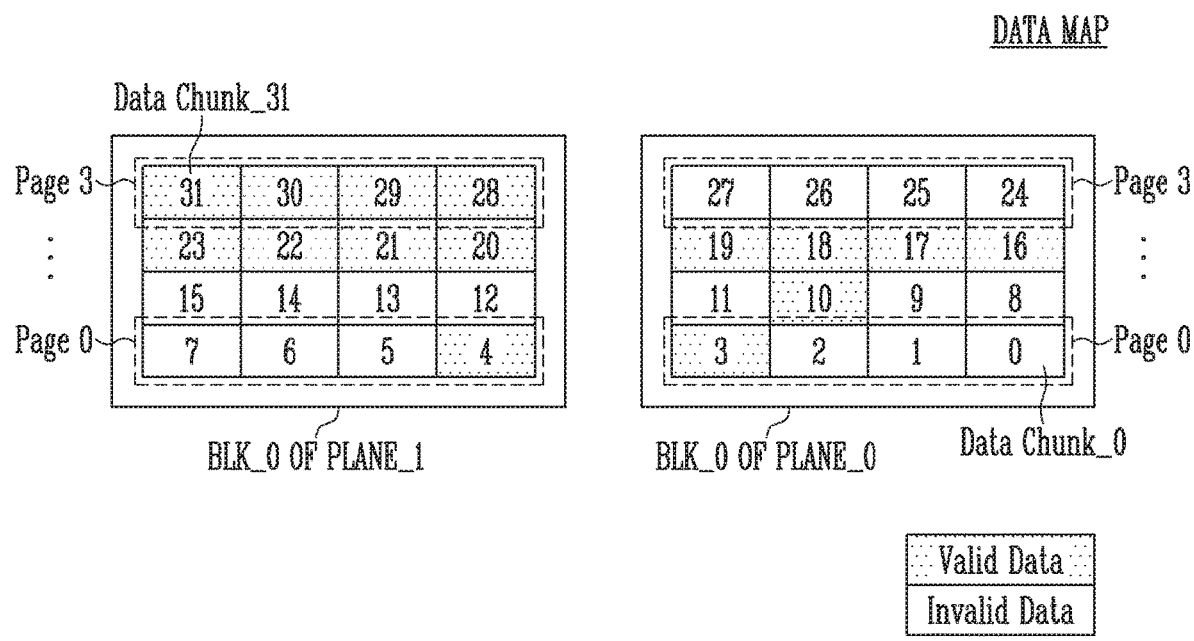
FIG. 9 is a diagram illustrating a data map of FIG. 8.

FIG. 9 is a diagram illustrating the data map DATA MAP of FIG. 8. The data map of FIG. 9 may be generated by the data map generator 213 of the garbage collection controller 210 in FIG. 8.

Referring to FIG. 9, the data map may indicate storing locations of pieces of data stored in at least one memory block. For example, the data map may indicate locations where pieces of valid data are stored in the memory block or where pieces of invalid data are stored in the memory block. For example, the data map indicates storing locations of pieces of valid data, which are respectively stored in a 0-th memory block BLK_0 of a 0-th plane Plane_0 and a 0-th memory block BLK_0 of a first plane Plane_1.

Pieces of data stored in a single memory block may be divided into data chunks. That is, the data may be stored on a data chunk basis in the memory block.

In FIG. 9, by way of example, a single memory block includes four pages and a single page is capable of storing four data chunks. For example, each of the 0-th memory block BLK_0 of the 0-th plane Plane_0 and the 0-th memory block BLK_0 of the first plane Plane_1 includes 0-th to third pages Page 0 to Page 3, and each page is capable of storing four data chunks. The number of data chunks stored in a single memory block is not limited by the present embodiment.

The data may be classified as valid data or invalid data. The valid data may be either data that is not requested to be updated by a host or data that has recently been updated. The invalid data may be data that is requested to be updated by the host. In FIG. 9, a dotted portion indicates valid data and a non-dotted portion indicates invalid data. In an embodiment, a single data chunk may be classified as a valid data chunk indicating valid data or as an invalid data chunk indicating invalid data.

The data map DATA MAP may be stored in bitmap format. For example, the valid data chunk may indicate '1', and the invalid data chunk may indicate '0'. Alternatively, the valid data chunk may indicate '0', and the invalid data chunk may indicate '1'.

In FIG. 9, the 0-th memory block BLK_0 of the 0-th plane Plane_0 stores 0-th to third data chunks, eighth to 11-th data chunks, 16-th to 19-th data chunks, and 24-th to 27-th data chunks. The third data chunk, the tenth data chunk, and the 16-th to 19-th data chunks may be valid data chunks. The remaining data chunks stored in the 0-th memory block BLK_0 of the 0-th plane Plane_0 may be invalid data chunks.

The 0-th memory block BLK_0 of the first plane Plane_1 may store 4-th to 7-th data chunks, 12-th to 15-th data chunks, 20-th to 23-th data chunks, and 28-th to 31-st data chunks. The fourth data chunk, the 20-th to 23-th data chunks, and the 28-th to 31-st data chunks may be valid data chunks. The remaining data chunks stored in the 0-th memory block BLK_0 of the first plane Plane_1 may be invalid data chunks.

In an embodiment, the data map may indicate, for each page offset, which one of a valid data chunk and an invalid data chunk corresponds to each of a plurality of data chunks stored in victim blocks. Each page offset may be a page number indicating the corresponding page, among pages included in a memory block.

For example, each memory block may include first to N-th pages. Respective page offsets of the first to N-th pages may be 1 to N. Each page offset may be a page number indicating the corresponding page, among pages included in a memory block. The first to N-th pages may respectively correspond to first to N-th word lines coupled to the memory block. Therefore, although the pages are included in different memory blocks, pages having the same page offset may have the same page number. The pages having the same page offset may correspond to the same word line.

In an embodiment, when the memory device includes multiple planes, pages that are included in memory blocks disposed at different locations included in different planes may also have the same page offset.

For example, in the 0-th memory block BLK_0 of the 0-th plane Plane_0, respective page offsets of the 0-th to third pages Page 0 to Page 3 may be 0 to 3. For pages included in the 0-th memory block BLK_0 of the first plane Plane_1, page offsets may be set in the same manner.

Figure 10:
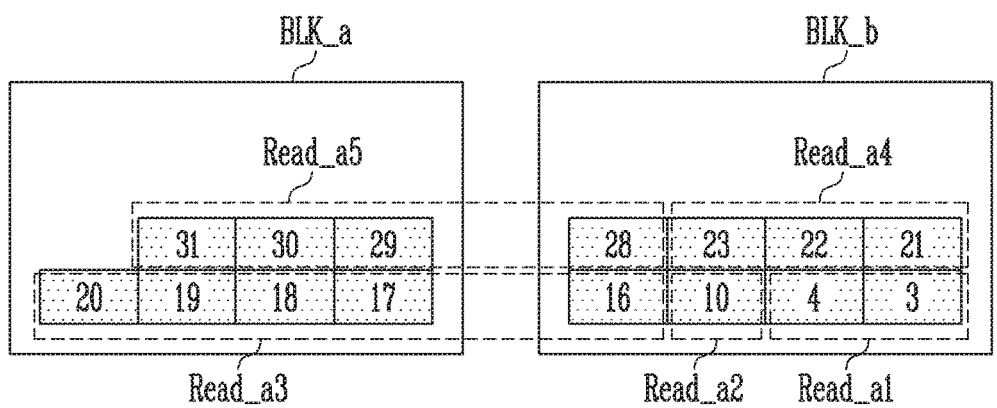
FIG. 10 is a diagram illustrating a normal read operation performed on valid data stored in memory blocks of FIG. 9.

FIG. 10 is a diagram illustrating a normal read operation performed on valid data stored in memory blocks of FIG. 9. The normal read operation of FIG. 10 may be performed by the memory controller 200 controlling the memory device 100 in FIG. 1.

Referring to FIGS. 9 and 10, after pieces of valid data stored in the 0-th memory block BLK_0 of the 0-th plane Plane_0 and the 0-th memory block BLK_0 of the first plane Plane_1 have been read, the pieces of valid data may be stored in a memory block BLK_a and a memory block BLK_b. The memory block BLK_a and the memory block BLK_b may be memory blocks allocated so as to store data. For example, the memory block BLK_a and the memory block BLK_b may be free blocks for storing valid data, stored in victim blocks, during a garbage collection operation.

When the memory device 100 includes multiple planes, the memory controller 200 may perform a multi-plane operation of simultaneously performing operations on memory areas included in the multiple planes of the memory device 100. Therefore, the memory controller 200 may simultaneously store data in pages included in different planes or may simultaneously read the stored data from the pages. The operation of simultaneously reading data from pages included in different planes may be a multi-plane read operation.

For example, as illustrated in FIG. 9, the memory controller 200 may perform a multi-plane read operation on the 0-th page Page 0 of the 0-th memory block BLK_0 of the 0-th plane Plane_0 and on the 0-th page Page 0 of the 0-th memory block BLK_0 of the first plane Plane_1. Also, the memory controller 200 may perform a multi-plane read operation on the 0-th page Page 0 of the 0-th memory block BLK_0 of the 0-th plane Plane_0 and on the third page Page 3 of the 0-th memory block BLK_0 of the first plane Plane_1.

In FIG. 10, by way of example, the maximum size of data that can be read or programmed at one time by the memory controller 200 through a multi-plane operation is a size corresponding to eight data chunks. Thus, the maximum number of data chunks stored in a write buffer may be 8. The maximum size of data that can be read or programmed at one time through a multi-plane operation is not limited by the present embodiment.

The write buffer may be a space in which data to be programmed is temporarily stored. The data to be programmed may be continuously read until the storage space of the write buffer is full. Once the storage space of the write buffer is full, the stored data to be programmed may be stored in an additional memory block. After the data to be programmed has been stored in the additional memory block, the data temporarily stored in the write buffer may be deleted.

In an embodiment, valid data chunks stored in victim blocks may be read until the storage space of the write buffer is full. Alternatively, valid data chunks stored in victim blocks may be read until the number of data chunks stored in the write buffer reaches the maximum number.

For example, during a first normal read operation Read_a1, pages in which 0-th to 7-th data chunks are stored may be read, and third and fourth data chunks, which are valid data chunks, may be temporarily stored in the write buffer.

During a second normal read operation Read_a2, pages in which eighth to 15-th data chunks are stored may be read, and a tenth data chunk that is a valid data chunk may be temporarily stored in the write buffer.

During a third normal read operation Read_a3, pages in which 16-th to 23-rd data chunks are stored may be read. Among the 16-th to 23-rd data chunks that are valid data chunks, the 16-th to 20-th data chunks corresponding to five data chunks, which are the remaining spaces of the write buffer, may be temporarily stored in the write buffer.

Here, since the number of data chunks temporarily stored in the write buffer is 8 that is the maximum number, the storage space of the write buffer may be full. Therefore, the third and fourth data chunks, the tenth data chunk, and the 16-th to 20-th data chunks that are temporarily stored in the write buffer may be stored in the memory blocks BLK_a and BLK_b. Thereafter, the data chunks temporarily stored in the write buffer may be deleted, and a data read operation may resume when data to be stored remains.

During a fourth normal read operation Read_a4, pages in which 16-th to 23-rd data chunks are stored may be read. Among the 16-th to 23-rd data chunks that are valid data chunks, 21-st to 23-rd data chunks that are not yet stored in the memory blocks BLK_a and BLK_b may be temporarily stored in the write buffer.

During a fifth normal read operation Read_a5, pages in which 24-th to 31-st data chunks are stored may be read. The 28-th to 31-st data chunks that are valid data chunks may be temporarily stored in the write buffer.

When all of the data to be stored has been read, the memory controller 200 may store the data chunks, temporarily stored in the write buffer, in the memory blocks, and then terminate the operation. Therefore, all of the read operation on the data is completed, and the 21-st to 23-rd data chunks and the 28-th to 31-st data chunks, temporarily stored in the write buffer, may be stored in the memory blocks BLK_a and BLK_b.

Figures 11, 12:
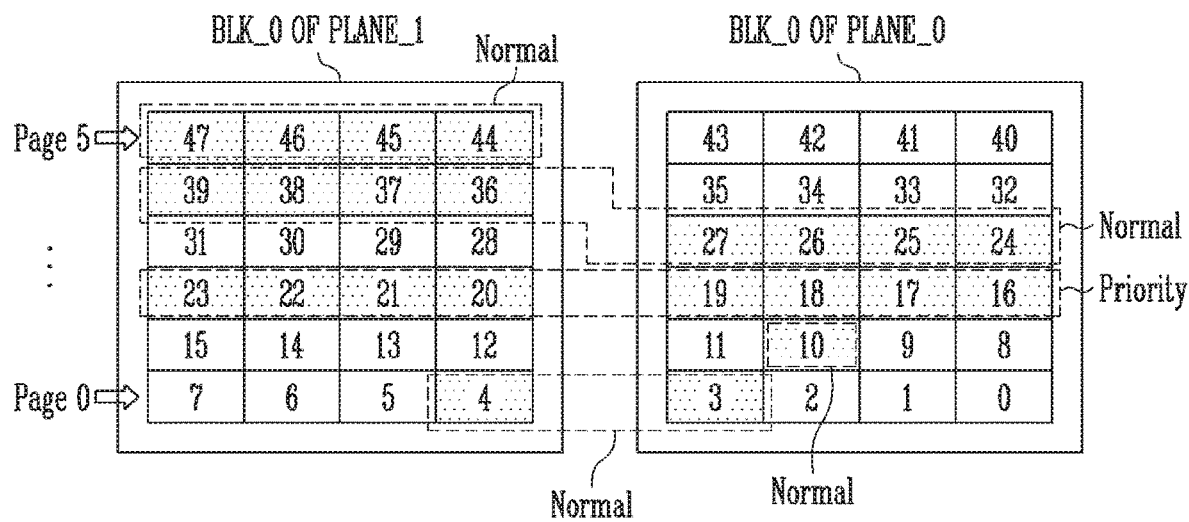
FIG. 11 is a diagram illustrating read sequence information depending on a normal read operation.
FIG. 12 is a diagram illustrating a data read operation in accordance with an embodiment of the present disclosure.

FIG. 11 is a diagram illustrating read sequence information a depending on a normal read operation. The read sequence information of FIG. 11 may be generated by the read sequence determinator 212 of the garbage collection controller 210 in FIG. 8.

Referring to FIG. 11, the read sequence information may include a read sequence (Read Seq) indicating a sequence, in which data chunks stored in memory blocks are read, and page offsets of pages in which data chunks are stored. Each page offset may be a page number indicating the corresponding page, among pages included in a memory block.

In FIG. 11, the read sequence information may denote a sequence in which pages that store valid data chunks among a plurality of data chunks to be read are read.

For example, the read sequence information may represent a sequence in which pages that store valid data chunks are read depending on the first to fifth normal read operations Read_a1 to Read_a5, described above with reference to FIG. 10.

The pages that are present at a first position in the read sequence (Read Seq) may be the 0-th page, having a page offset of 0, in the 0-th memory block BLK_0 of the 0-th plane Plane_0 that stores the third data chunk (3), and the 0-th page, having a page offset of 0, in the 0-th memory block BLK_0 of the first plane Plane_1 that stores the fourth data chunk (4).

A page that is present at a second position in the read sequence (Read Seq) may be the first page, having a page offset of 1, in the 0-th memory block BLK_0 of the 0-th plane Plane_0 that stores the tenth data chunk (10).

The pages that are present at a third position in the read sequence (Read Seq) may be the second page, having a page offset of 2, in the 0-th memory block BLK_0 of the 0-th plane Plane_0 that stores the 16-th to 19-th data chunks (16, 17, 18, 19), and the second page, having a page offset of 2, in the 0-th memory block BLK_0 of the first plane Plane_1 that stores the 20-th data chunk (20).

A page that is present at a fourth position in the read sequence (Read Seq) may be the second page, having a page offset of 2, in the 0-th memory block BLK_0 of the first plane Plane_1 that stores the 21-st to 23-th data chunks (21, 22, 23).

A page that is present at a fifth position in the read sequence (Read Seq) may be the third page, having a page offset of 3, in the 0-th memory block BLK_0 of the first plane Plane_1 that stores the 28-th to 31-st data chunks (28, 29, 30, 31).

During a normal read operation, the read sequence in which the pages are read may be changed.

FIG. 12 is a diagram illustrating a data read operation a in accordance with an embodiment of the present disclosure. The data read operation a of FIG. 12 may be performed by the memory controller 200 controlling the memory device 100 in FIG. 1.

Referring to FIG. 12, by way of example, a 0-th memory block BLK_0 of a 0-th plane Plane_0 and a 0-th memory block BLK_0 of a first plane Plane_1 store 0-th to 47-th data chunks. The number of data chunks that are stored in memory blocks is not limited by the present embodiment.

Pages, in which all data chunks stored in pages that can be simultaneously read through a multi-plane read operation are valid data chunks, may be preferentially read (with a high priority). In an embodiment, pages that have the same page offset and store only valid data chunks may be preferentially read. Thereafter, the remaining pages that store valid data chunks may be sequentially read.

For example, second pages Page 2 respectively included in 0-th and first planes Plane 0 and Plane 1 may be pages that have the same page offset and store only valid data chunks. Therefore, the second pages Page 2 (16, 17, 18, 19, 20, 21, 22, 23) may be preferentially read.

Thereafter, the remaining pages that store 3-rd and 4-th data chunks (3, 4), a 10-th data chunk (10), 24-th to 27-th data chunks (24, 25, 26, 27), 36-th to 39-th data chunks (36, 37, 38, 39), and 44-th to 47-th data chunks (44, 45, 46, 47) may be sequentially read.

Figure 13:
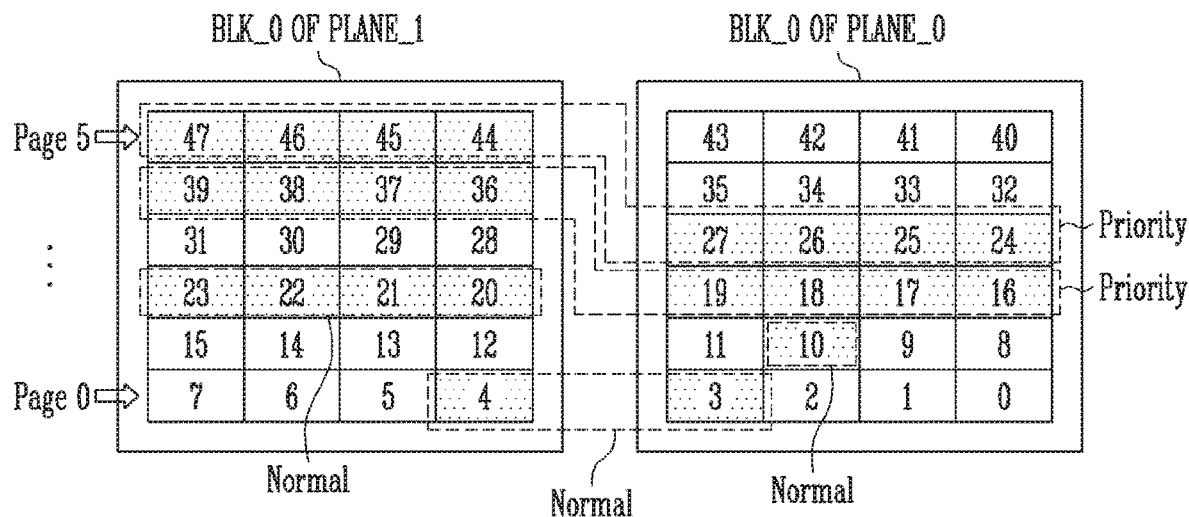
FIG. 13 is a diagram illustrating a data read operation in accordance with an embodiment of the present disclosure.

FIG. 13 is a diagram illustrating a data read operation b in accordance with an embodiment of the present disclosure. The data read operation b of FIG. 13 may be performed by the memory controller 200 controlling the memory device 100 in FIG. 1.

Referring to FIG. 13, pages, in which all data chunks stored in pages that can be simultaneously read through a multi-plane read operation are valid data chunks, may be preferentially read with a high priority.

In an embodiment, pages that have different page offsets and store only valid data chunks may be preferentially read. Thereafter, the remaining pages that store valid data chunks may be sequentially read.

For example, a second page Page 2, having a page offset of 2, in a 0-th memory block BLK_0 of a 0-th plane Plane_0 and a fourth page Page 4, having a page offset of 4, in a 0-th memory block BLK_0 of a first plane Plane_1, may be pages that have different page offsets and store only valid data chunks. Therefore, the second page Page 2 (16, 17, 18, 19) included in the 0-th plane Plane_0 and the fourth page Page 4 (36, 37, 38, 39) included in the first plane Plane_1 may be preferentially read. Similarly, a third page Page 3 (24, 25, 26, 27) included in the 0-th plane Plane_0 and a fifth page Page 5 (44, 45, 46, 47) included in the first plane Plane_1 may be preferentially read. The pages that are preferentially read may be sequentially read. Thereafter, the remaining pages that store valid data chunks may be sequentially read.

For example, the pages that store third and fourth data chunks (3, 4), a tenth data chunk (10), and 20-th to 23-rd data chunks (20, 21, 22, 23) may be sequentially read.

Figure 14:
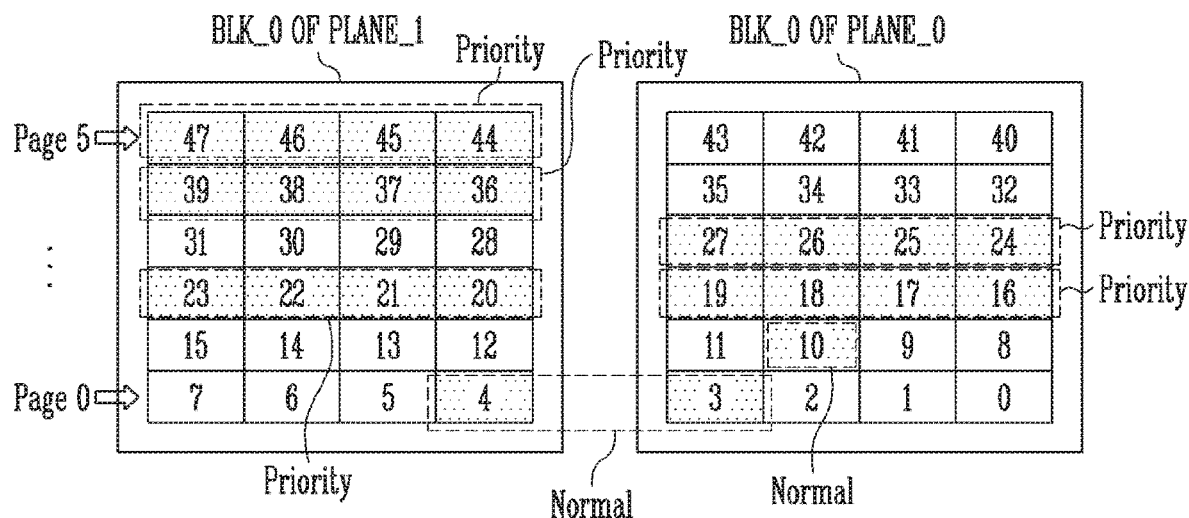
FIG. 14 is a diagram illustrating a data read operation in accordance with an embodiment of the present disclosure.

FIG. 14 is a diagram illustrating a data read operation c in accordance with an embodiment of the present disclosure. The data read operation c of FIG. 14 may be performed by the memory controller 200 controlling the memory device 100 in FIG. 1.

Referring to FIG. 14, pages in which all data chunks stored in pages are valid data chunks may be preferentially read with a high priority. That is, pages that store only valid data chunks may be preferentially read.

For example, a second page Page 2 and 4th and 5th pages Page 4 and Page 5 of a 0-th memory block BLK_0 of a 1st plane Plane_1, and second and third pages Page 2 and Page 3 of a 0-th memory block BLK_0 of a 0-th plane Plane_0 may be pages that store only valid data chunks. Therefore, the corresponding pages may be preferentially read. The pages that are preferentially read may be sequentially read.

Thereafter, the remaining pages that store valid data chunks may be sequentially read. For example, the pages that store third and fourth data chunks (3, 4) and a tenth data chunk (10) may be sequentially read.

Figure 15:
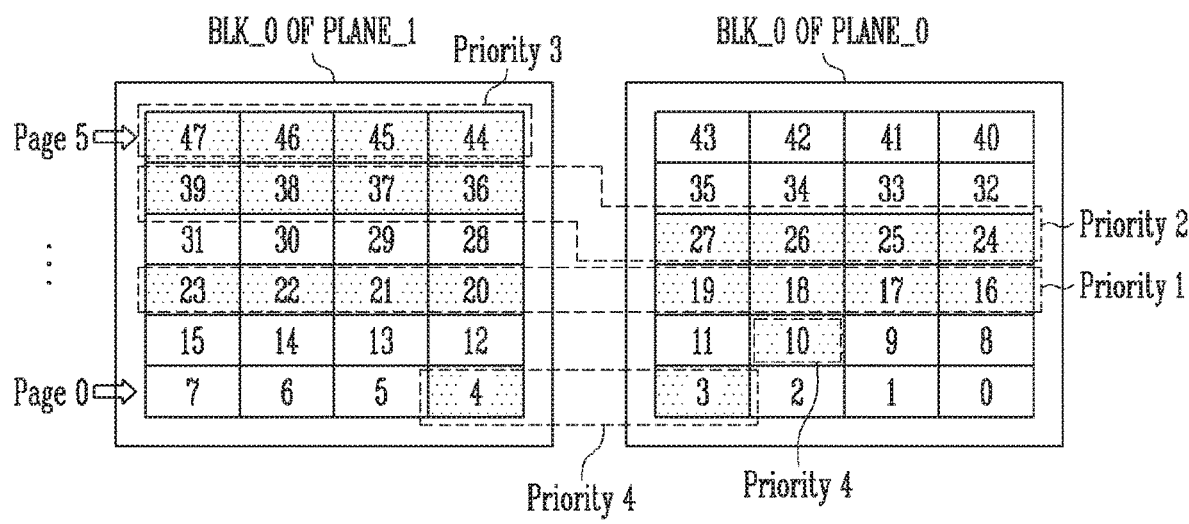
FIG. 15 is a diagram illustrating read priorities in accordance with an embodiment of the present disclosure.

FIG. 15 is a diagram illustrating read priorities in accordance with an embodiment of the present disclosure.

Referring to FIG. 15, the read priorities may indicate the sequence of pieces of data that are preferentially read, among a plurality of pieces of data. In detail, the read priorities may indicate pages that are preferentially read, among pages that store valid data chunks of memory blocks. Individual pages having the same read priority may be sequentially read regardless of the read priorities. The read sequence may be determined depending on a data map and preset read priorities.

The read priorities may be determined in the sequence of pages having the same page offset, pages having different page offsets, and the remaining pages, among the pages that store only valid data chunks, and the remaining pages that store valid data chunks.

In an embodiment, pages having a first read priority (Priority 1) may be pages that have the same page offset and store only valid data chunks.

Pages having a second read priority (Priority 2) may be pages that have different page offsets and store only valid data chunks, among the remaining pages that are not read.

Pages having a third read priority (Priority 3) may be pages that store only valid data chunks, among the remaining pages that are not read.

Pages having a fourth read priority (Priority 4) may be the remaining pages that are not read.

The pages having higher read priorities are read first, and the pages having the same read priority may be sequentially read regardless of the read priorities.

For example, pages that have the first read priority (Priority 1) and store 16-th to 23-rd data chunks (16 to 23) may be read first. Thereafter, pages that have the second read priority (Priority 2) and store 24-th to 27-th and 36-th to 39-th data chunks (24 to 27, 36 to 39) may be read. Thereafter, pages that have the third read priority (Priority 3) and store 44-th to 47-th data chunks (44 to 47) may be read. Thereafter, pages that have the fourth read priority (Priority 4) and store third and fourth data chunks (3, 4) and a tenth data chunk (10) may be read.

Figure 16:
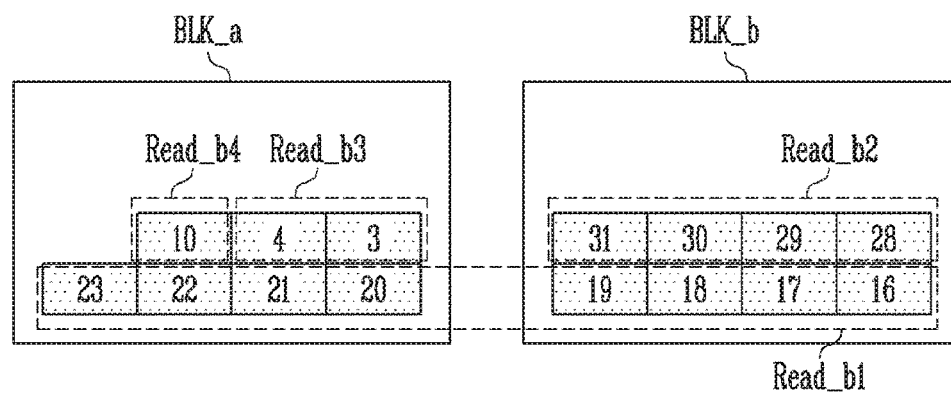
FIG. 16 is a diagram illustrating an operation of reading valid data stored in the memory blocks of FIG. 9 depending on read priorities.

FIG. 16 is a diagram illustrating an operation of reading valid data stored in the memory blocks of FIG. 9 depending on read priorities. The operation of FIG. 16 may be performed by the memory controller 200 controlling the memory device 100 in FIG. 1.

Referring to FIG. 16, pieces of data that are read in a read sequence determined depending on the read priorities, described above with reference to FIG. 15, may be stored in a memory block BLK_a and a memory block BLK_b.

A description will be made based on the maximum size of data that can be read or programmed at one time through a multi-plane operation, which is a size corresponding to eight data chunks. Here, the maximum number of data chunks temporarily stored in a write buffer for programming may be 8. The maximum size of data that can be programmed at one time through a multi-plane operation is not limited by the present embodiment.

For example, pages that have a first read priority (Priority 1) and store 16-th to 23-rd data chunks (16 to 23) may be read first (Read_b1). Thereafter, since pages having a second read priority (Priority 2) are not present, pages that have a third read priority (Priority 3) and store 28-th to 31-st data chunks (28 to 31) may be read (Read_b2). Thereafter, pages that have a fourth read priority (Priority 4) and store third and fourth data chunks (3, 4) and a tenth data chunk (10) may be sequentially read (Read_b3, Read_b4).

Therefore, during a first priority read operation Read_b1, pages that store 16-th to 23-rd data chunks may be read. The 16-th to 23-rd data chunks (16 to 23) that are valid data chunks may be temporarily stored in the write buffer.

The 16-th to 23-rd data chunks, temporarily stored in the write buffer, may be stored in memory blocks BLK_a and BLK_b. Thereafter, the data chunks, temporarily stored in the write buffer, may be deleted. When there is remaining data to be read, the data read operation may resume.

During a second priority read operation Read_b2, pages that store 24-th to 31-st data chunks may be read, and 28-th to 31-st data chunks (28 to 31) that are valid data chunks may be temporarily stored in the write buffer.

During a third priority read operation Read_b3, pages that store 0-th to 7th data chunks may be read, and third and fourth data chunks (3, 4) that are valid data chunks may be temporarily stored in the write buffer.

During a fourth priority read operation Read_b4, pages that store 8th to 15th data chunks may be read, and a 10-th data chunk (10) that is the valid data chunk may be temporarily stored in the write buffer.

When all of the data to be read has been read, the memory controller 200 may store the data chunks, temporarily stored in the write buffer, in the memory blocks, and may then terminate the operation. Therefore, all of the priority read operations on the data are completed, and the 16-th to 23-rd data chunks and the 28-th to 31-st data chunks, temporarily stored in the write buffer, may be stored in the memory blocks BLK_a and BLK_b.

When priority read operations are performed on the data stored in the memory blocks of FIG. 9, the total number of read operations may be decreased from 5 (i.e., Read_a1 to Read_a5) to 4 (i.e., Read_b1 to Read_b4) compared to a case where the normal read operations, described above with reference to FIG. 10, are performed. The total read time may be decreased, and the speed of the read operation on valid data stored in victim blocks during a garbage collection operation may be improved. That is, the speed of the garbage collection operation may be improved by assigning read priorities and reading pieces of data in the read sequence determined depending on the assigned read priorities.

Figures 17, 18:
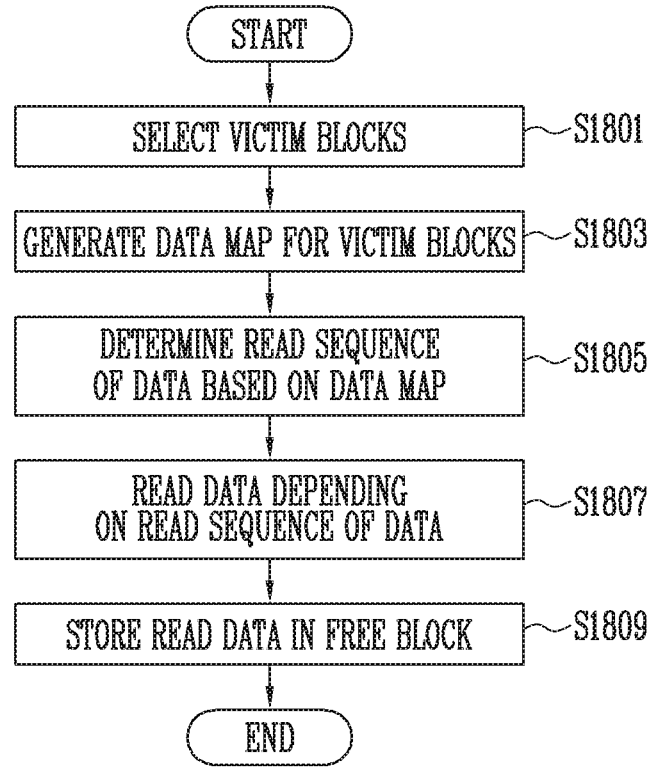
FIG. 17 is a diagram illustrating read sequence information indicating a read sequence determined depending on read priorities.
FIG. 18 is a flowchart illustrating an operation of a memory controller in accordance with an embodiment of the present disclosure.

FIG. 17 is a diagram illustrating read sequence information b indicating a read sequence determined depending on read priorities. The read sequence information b of FIG. 17 may be generated by the read sequence determinator 212 of the garbage collection controller 210 in FIG. 8.

Referring to FIG. 17, the read sequence information b may include a read sequence (Read Seq) indicating a sequence in which data chunks stored in memory blocks are read and respective page offsets of pages in which data chunks are stored. Each page offset may be a page number indicating the corresponding page, among pages included in a memory block.

The read sequence information b may refer to a read sequence (Read Seq) determined depending on the read priorities described above with reference to FIG. 15. In detail, the read sequence (Read Seq) may denote a sequence in which pages that store valid data chunks, among a plurality of data chunks stored in victim blocks determined depending on the read priorities, are read.

In FIG. 17, the read sequence information b may represent a sequence in which pages that store pieces of valid data chunks that are read depending on the first to fourth priority read operations Read_b1 to Read_b4, which are described above with reference to FIG. 16, are read.

For example, pages that store 16-th to 23-rd data chunks (16 to 23) have a first read priority (Priority 1). The pages that store 28-th to 31-st data chunks (28 to 31) have a third read priority (Priority 3). The pages that store 3-th and 4-th data chunks (3, 4) and a 10-th data chunk (10) have a fourth read priority (Priority 4).

Therefore, the position in the read sequence (Read Seq) of the pages that store the 16-th to 23-rd data chunks (16 to 23) determined depending on the read priorities may be a first position. The position in the read sequence (Read Seq) of the pages that store the 28-th to 31-st data chunks (28 to 31) may be a second position. The position in the read sequence (Read Seq) of the pages that store the 3-rd and 4-th data chunks (3, 4) may be a third position. The position in the read sequence (Read Seq) of the page that stores the 10-th data chunk (10) is stored may be a fourth position. The respective pages that store the 3-rd and 4-th data chunks (3, 4) and the 10-th data chunk (10) have the same read priority, that is, the fourth read priority (Priority 4), and thus the read sequence of the individual pages may be changed.

FIG. 18 is a flowchart illustrating an operation of a memory controller in accordance with an embodiment of the present disclosure, for example, the memory controller 200 in FIGS. 1 and 8.

Referring to FIG. 18, at step S1801, the memory controller 200 may select victim blocks for performing a garbage collection operation.

At step S1803, the memory controller 200 may generate a data map for the victim blocks. The data map may indicate storing locations of pieces of valid data, among pieces of invalid data and valid data stored in the victim blocks. In an embodiment, the data map may indicate the storing locations of valid data chunks, among a plurality of data chunks stored in the victim blocks.

At step S1805, the memory controller 200 may determine a read sequence in which the pieces of valid data, stored in the victim blocks, are to be read based on the generated data map. A criterion for determining the read sequence may be selected in various forms. For example, the criterion for determining the read sequence may include use information indicating whether the current page is a page that stores only valid data chunks, among the pages that are included in the victim blocks and that store valid data. Alternatively, the criterion for determining the read sequence may include use information indicating whether pages that are included in victim blocks and store valid data are simultaneously read.

At step S1807, the memory controller 200 may read the valid data stored in the victim blocks in the determined read sequence.

At step S1809, the memory controller 200 may store the read valid data in a free block. The memory controller 200 may provide a program command for storing the read valid data in the free block to the memory device 100. In an embodiment, the memory controller 200 may erase the victim blocks after storing the read valid data in the free block.

Figure 19:
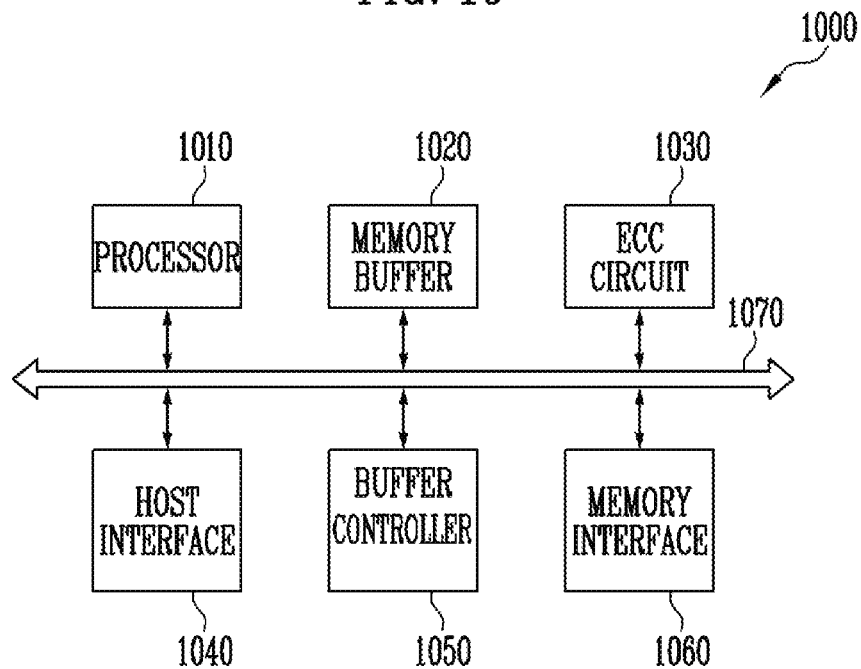
FIG. 19 is a diagram illustrating a memory controller in accordance with an embodiment of the present disclosure.

FIG. 19 is a diagram illustrating a memory controller in accordance with an embodiment of the present disclosure, for example, the memory controller 1000 of FIG. 1.

Referring to FIG. 19, the memory controller 1000 is coupled to a host and a memory device. In response to a request received from the host, the memory controller 1000 may access the memory device. For example, the memory controller 1000 may be configured to control write, read, erase, and to perform background operations of the memory device. The memory controller 1000 may provide an interface between the memory device and the host. The memory controller 1000 may run firmware for controlling the memory device.

The memory controller 1000 may include a processor 1010, a memory buffer 1020, an error checking and correction (ECC) unit 1030, a host interface 1040, a buffer controller 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer controller 1050. The processor 1010 may control the operation of the memory device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in a memory cell array of the memory device.

The processor 1010 may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer controller 1050 may control the memory buffer 1020 under the control of the processor 1010.

The memory interface 1060 may communicate with the memory device under the control of the processor 1010. The memory interface 1060 may transmit and receive commands, addresses, and data to and from the memory device through channels.

In an embodiment, the memory controller 1000 may not include the memory buffer 1020 and the buffer controller 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer controller 1050, the ECC circuit 1030, and the memory interface 1060. The control bus may be coupled to the host interface 1040, the processor 1010, the buffer controller 1050, the memory buffer 1020, and the memory interface 1060.

Figure 20:
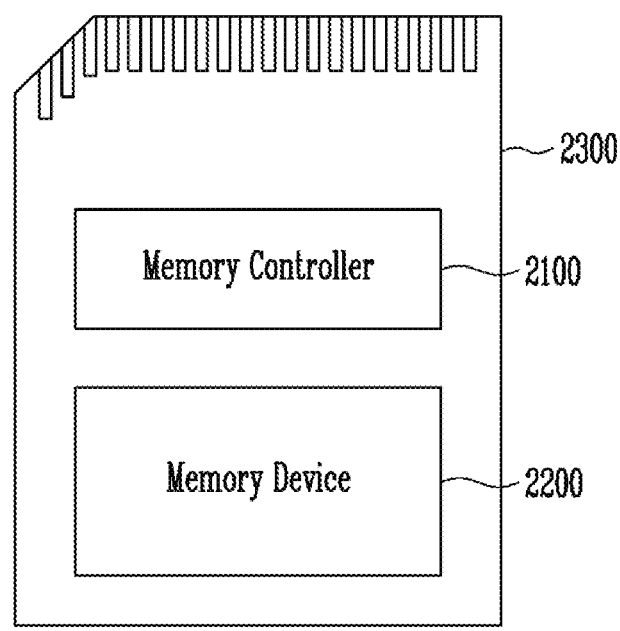
FIG. 20 is a block diagram illustrating a memory card system to which a storage device in accordance with an embodiment of the present disclosure is applied.

FIG. 20 is a block diagram illustrating a memory card system 2000 to which the storage device in accordance with an embodiment of the present disclosure is applied.

Referring to FIG. 20, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200 described above with reference to FIG. 1.

In an embodiment, the memory controller 2100 may include components, such as a random access memory (RAM), a processing unit, a host interface, a memory interface, and an error correction code (ECC) unit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and non-volatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-M RAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (e.g., SM or SMC), a memory stick, a multimedia card (e.g., MMC, RS-MMC, MMCmicro or eMMC), a secure digital (SD) card (e.g., SD, miniSD, microSD, or SDHC), or a universal flash storage (UFS).

Figure 21:
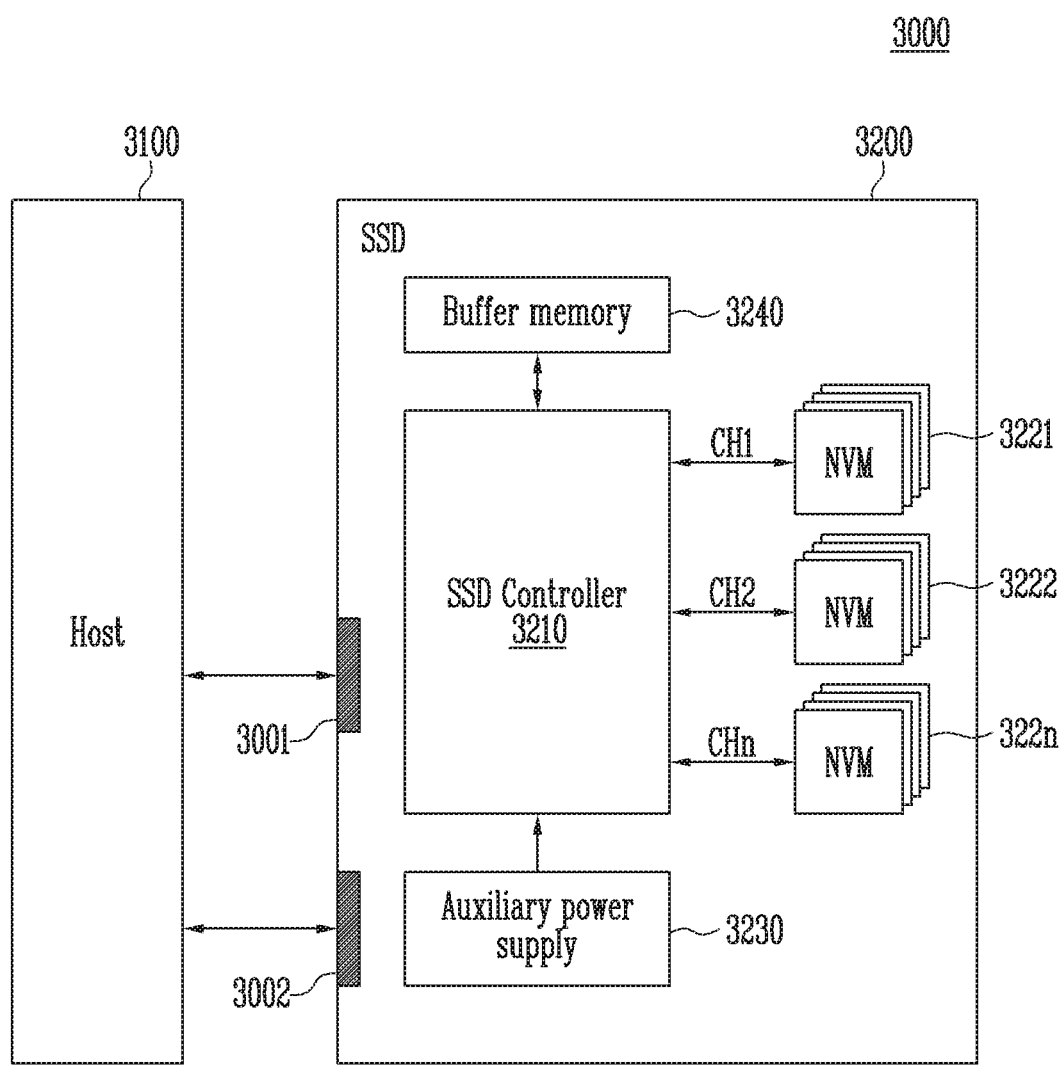
FIG. 21 is a block diagram illustrating a solid state drive (SSD) system to which a storage device in accordance with an embodiment of the present disclosure is applied.

FIG. 21 is a block diagram illustrating a solid state drive (SSD) system 3000 to which the storage device in accordance with an embodiment of the present disclosure is applied.

Referring to FIG. 21, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 22:
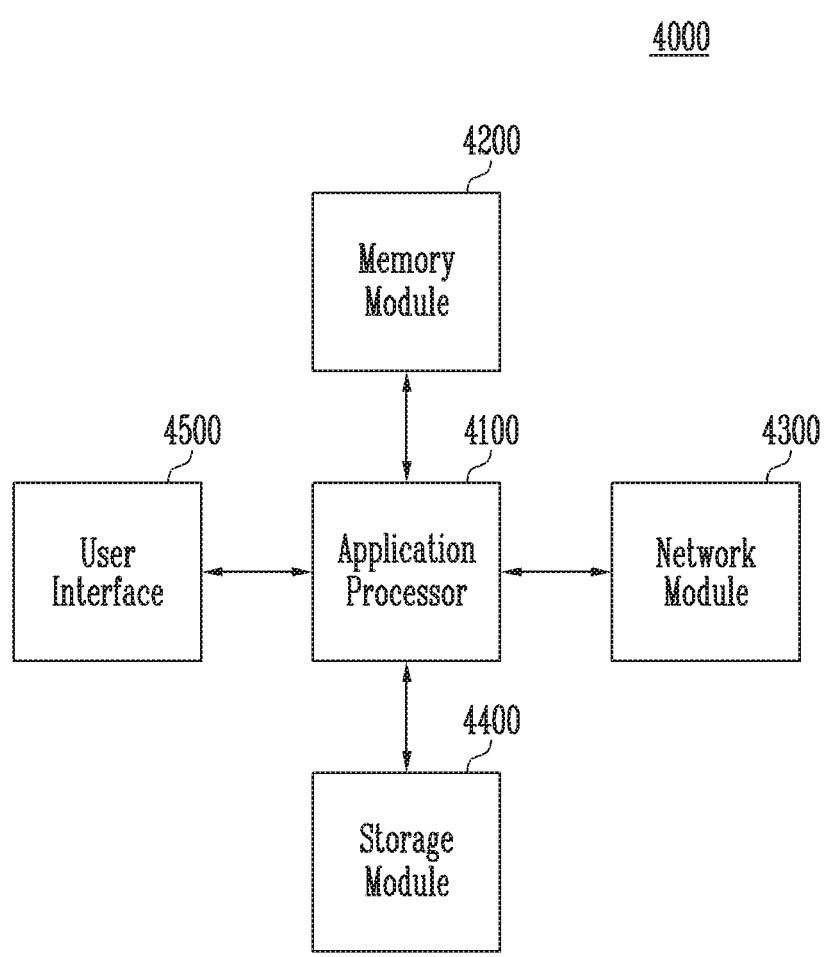
FIG. 22 is a block diagram illustrating a user system to which a storage device in accordance with an embodiment of the present disclosure is applied.

FIG. 22 is a block diagram illustrating a user system 4000 to which the storage device in accordance with an embodiment of the present disclosure is applied.

Referring to FIG. 22, the user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device 100 described above with reference to FIG. 1. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, there are provided a storage device having improved speed of a garbage collection operation and a method of operating the storage device.

While the exemplary embodiments of the present disclosure have been disclosed for illustrative purposes, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be sequentially performed in given order, and may be randomly performed. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory controller for controlling a memory device, which includes two or more planes each including a plurality of memory blocks, which are capable of being simultaneously operated, wherein each of two or more memory blocks in different planes, among the two or more planes, stores a plurality of data chunks, the memory controller comprising:
   a data map generator configured to generate a data map that indicates locations of stored valid data chunks among the plurality of data chunks using page offsets;
   a read sequence determinator configured to determine a read sequence in which the valid data chunks are to be read based on the data map; and
   a command input controller configured to provide a read command for the valid data chunks to the memory device based on the read sequence,
   wherein each of the two or more memory blocks comprises a plurality of pages,
   each of the plurality of pages stores at least two of the plurality of data chunks, and
   the data map indicates whether each of the plurality of data chunks is a valid data chunk or an invalid data chunk, using the page offsets that are page numbers of the plurality of pages.

2. The memory controller according to claim 1, wherein the command input controller is configured to provide the memory device with a program command for storing data that is read in response to the read command in an additional memory block other than the two or more memory blocks, among the plurality of memory blocks.

3. The memory controller according to claim 2, wherein the read sequence determinator is configured to determine the read sequence depending on whether read operations on the valid data chunks are simultaneously performed.

4. The memory controller according to claim 2, wherein the read sequence determinator is configured to determine the read sequence such that after pages that are simultaneously read which store only valid data chunks, have been read, remaining pages that store valid data chunks are sequentially read.

5. The memory controller according to claim 4, wherein the simultaneously read pages have an identical page offset.

6. The memory controller according to claim 4, wherein the simultaneously read pages have different offsets.

7. The memory controller according to claim 2, wherein the read sequence determinator is configured to determine the read sequence such that, after pages that store only valid data chunks have been read, remaining pages that store valid data chunks are sequentially read.

8. The memory controller according to claim 2, wherein the read sequence determinator is configured to determine the read sequence based on preset read priorities and the data map.

9. The memory controller according to claim 8, wherein the read priorities are set in a sequence of pages having an identical page offset, pages having different page offsets, and remaining pages, among pages that store at least one or more valid data chunks.

10. The memory controller according to claim 8, wherein the read priorities are set in a sequence of pages having an identical page offset, pages having different page offsets, and remaining pages, among pages that store only valid data chunks.

11. A method for operating a memory controller for controlling a memory device, which includes two or more planes each including a plurality of memory blocks, which are capable of being simultaneously operated, wherein each of two or more memory blocks in different planes, among the two or more planes, stores a plurality of data chunks, the method comprising:
   generating a data map that indicates locations of stored valid data chunks among the plurality of data chunks using page offsets;
   determining a read sequence in which the valid data chunks are to be read based on the data map depending on whether read operations on the valid data chunks are simultaneously performed; and
   providing a read command for the valid data chunks to the memory device in the read sequence,
   wherein each of the two or more memory blocks comprises a plurality of pages,
   each of the plurality of pages stores at least two of the plurality of data chunks, and
   the data map indicates whether each of the plurality of data chunks is a valid data chunk or an invalid data chunk, using the page offsets that are page numbers of the plurality of pages.

12. The method according to claim 11, further comprising providing the memory device with a program command for storing data that is read in response to the read command in an additional memory block other than the two or more memory blocks, among the plurality of memory blocks.

13. The method according to claim 12, wherein the determining of the read sequence comprises determining the read sequence such that after pages that are simultaneously read which store only valid data chunks, have been read, remaining pages that store valid data chunks are sequentially read.

14. The method according to claim 12, wherein the determining of the read sequence comprises determining the read sequence based on preset read priorities and the data map.

15. The method according to claim 14, wherein the read priorities are set in a sequence of pages having an identical page offset, pages having different page offsets, and remaining pages, among pages that store valid data chunks.

16. A storage device, comprising:
a memory device including multiple planes, each including a plurality of memory blocks; and
a memory controller configured to:
generate a data map indicating locations of stored valid data chunks among a plurality of data chunks,
determine a read sequence according to whether read operations on the valid data chunks are simultaneously performed based on the data map, and
control the memory device to read the valid data chunks based on the read sequence,
wherein the plurality of data chunks are stored in two or more memory blocks in different planes, among the plurality of memory blocks,
wherein the data map indicates the locations of the stored valid data chunks using page offsets of pages included in the two or more memory blocks, and
wherein each of the two or more memory blocks comprises a plurality of pages,
each of the plurality of pages stores at least two of the plurality of data chunks, and
the data map indicates whether each of the plurality of data chunks is a valid data chunk or an invalid data chunk, using the page offsets that are page numbers of the plurality of pages.

17. The storage device according to claim 16, wherein the memory controller is configured to control the memory device to store the read valid data chunks in an additional memory block other than the two or more memory blocks, among the plurality of memory blocks.

* * * * *